Nov. 15, 1960 R. EMEIS 2,960,640

ELECTRIC SEMICONDUCTOR DEVICE OF THE P-N JUNCTION TYPE

Filed May 10, 1957

2,960,640

ELECTRIC SEMICONDUCTOR DEVICE OF THE P-N JUNCTION TYPE

Reimer Emeis, Pretzfeld, Germany, assignor to Siemens-Schuckertwerke Aktiengesellschaft, Berlin-Siemensstadt, Germany, a German corporation Filed May 10, 1957, Ser. No. 658,465

15 Claims. (Cl. 317—235)

Figure 1:
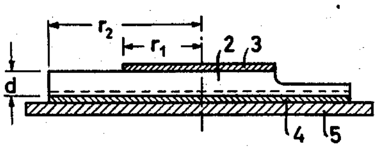

My invention relates to junction- or broad-area type rectifiers, transistors and other asymmetrically conducting semiconductor devices whose asymmetrical electric characteristics are due to the presence of one or more area junctions between semiconducting zones of different conductance type.

More particularly, my invention relates to an improved design of a semiconductor device which is equipped with a disc-shaped, essentially monocrystalline semiconductor body or wafer of given conductance type, and with a plurality of large-area metal electrodes located on respectively different sides of the semiconductor disc, at least one of these electrodes being designed and operated as a barrier electrode. The barrier electrode consists of a metal or alloy which comprises metal atoms suitable to act as substitutional defection points in the crystal lattice of the semiconductor substance so that the semiconductor zone immediately adjacent to the metal electrode becomes diffused with donor or acceptor atoms and hence has electric conductance of the opposed type, thus forming with the main semiconductor portion of the original conductance type a p-n junction which during operation of the device is electrically stressed in the blocking direction, i.e. in the direction opposed to the forward direction of current flow. Examples of such semiconductor devices are the known p-n junction rectifiers produced from germanium, silicon and other crystalline semiconductor substances by fusing and alloying them together with a barrier electrode and a barrier-free counter electrode. In the known p-n junction rectifiers the barrier-free counter electrode, as a rule, serves also as a supporting carrier or terminal for the device and completely, or nearly completely, covers one flat side of the usually circular semiconductor disc, whereas the barrier electrode, located on the other side of the disc, has a smaller diameter. This has the result that the "external p-n limit," i.e. the line at which the p-n junction emerges at the semiconductor surface near the edge of the barrier electrode, is readily accessible for subsequent processing, for instance etching, even if the barrier-free counter contact of the semiconductor assembly is already joined with a metallic carrier body which, preferably, is soldered or alloy-bonded to the assembly by same heat treatment that serves for alloy-bonding the electrodes to the semiconductor crystal.

The above-described design principle of the known p-n rectifiers, however, has the disadvantage that the occurrence of any conducting bridges across the external p-n limit, even if such contact bridges are extremely small, will form a direct short circuit between the p-type and n-type portions of the semiconductor crystal thus greatly impairing or virtually obviating the desired barrier effect. Such extreme sensitivity to conductive bridging is due to the fact that the spacing of the external p-n limit from the counter electrode is essentially the same as the distance of the entire p-n junction area from the counter electrode, which spacing is nearly equal to the thickness of the semiconductor body. The mentioned bridging of the external p-n limit may be caused by soiling, occurrence of residues and various other manufacturing conditions. Hence, for avoiding or eliminating such bridging during further processing of the rectifier units, special expedients as well as additional processing steps are required in most cases. The danger of such bridging is also the main reason why the finished semiconductor devices must be carefully sealed by embedding or gas-tight capsuling.

It is an object of my invention to greatly minimize the detrimental effects caused by bridging of the external p-n limit and to improve and facilitate the manufacture of junction type semiconductor devices, particularly with respect to those processing steps and expedients heretofore necessary to cope with the danger of impairment by contact bridging.

According to a fundamental concept and feature of my invention, therefore, I devise and design such semiconductor devices so that the current path from the external p-n limit to the barrier-free electrode has a much higher electric resistance per unit area of the path cross section than the current path of the operating electric current from one electrode to the other. Under such conditions any bridging of the external p-n limit can no longer form a direct short circuit but is merely a resistive shunt connection.

According to another feature of my invention the above-mentioned resistance conditions are achieved mainly by particular geometric features relating to the spacial arrangement and mutual relation of the electrodes on the semiconductor disc. More specifically, the surface of the barrier electrode, located on one side of the semiconductor disc, protrudes beyond the counter electrode, located on the other side of the semiconductor disc, to such an extent that the spacing between the external p-n limit and the edge of the counter electrode is considerably larger than the length of the current path extending directly between the two electrodes. More accurately, I give the barrier electrode such a size that it projects beyond the counter electrode, or rather its vertical projection onto the barrier electrode, for a distance which is a multiple of the length of the current path between barrier electrode and counter electrode, this current-path length being approximately equal to the thickness of the semiconductor disc.

With such a design and dimensional relation of the electrodes, the semiconductor device is substantially insensitive to electric bridging of the external p-n limit. That is, the device no longer reacts to occurrence of such bridging by losing its barrier effect. Indeed, under favorable circumstances, such bridging does not even produce any appreciable impairment of the rectifier characteristic. Such favorable conditions are achieved when the spacing between the edge of the barrier electrode and the edge of the barrier-free electrode is at least more than twice to three times the thickness of the semiconductor disc.

Figure 2:
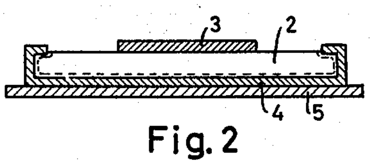
Figure 3:
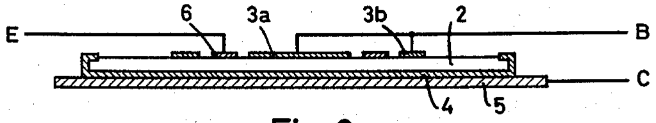
Figure 4:
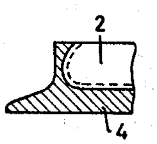
Figure 5:
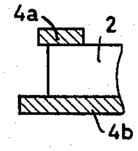
Figure 6:
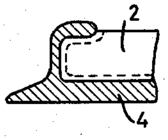

Various semiconductor devices according to the invention are illustrated on the drawing by way of example on greatly enlarged scale. Figs. 1 to 3 show cross sections of different semiconductor devices comprising approximately circular semiconductor discs, although analogous electrode shapes and arrangements are applicable also to semiconductor discs of other than circular shape. Figs. 4 to 6 illustrate respectively different details applicable to such semiconductor devices. In the various illustrations, corresponding components are denoted by the same reference characters.

The semiconductor device illustrated in Fig. 1 comprises a disc-shaped semiconductor body 2 consisting, for instance, of a p-conductive silicon monocrystal. Mounted on the upper flat side is a barrier-free counter electrode 3 consisting, for instance, of aluminum foil. The counter electrode is alloyed together with the semiconductor substance to form an intimate bond over the entire electrode area. Radius $r_1$ of electrode 3 is one-half of the disc radius $r_2$. Located on the bottom side of the semiconductor disc is a barrier electrode 4. This electrode may consist of gold with an antimony content of approximately 1% by weight. The barrier electrode is likewise bonded with the semiconductor disc by alloying. Due to the alloying process, an adjacent zone of the semiconductor disc 2 is converted to n-type conductance. This conversion is due to the fact that antimony atoms, acting as donors, are diffused into the surface zone of the silicon crystal. Between the n-type zone of the crystal and the remaining bulk which retains its p-type conductance, there is formed a p-n junction which is schematically indicated by a broken line 6. The p-n junction forms a substantially planar area, assuming that the depth of penetration of the electrode metal into the semiconductor substance is substantially uniform. The p-n junction area emerges at the outside along the cylindrical, peripheral surface portion of the semiconductor disc. This line or circle of emergence therefore is the location of the external p-n limit.

It should be understood that the portion of the device shown at the right of the vertical center line in Fig. 1 represents a slightly modified design as compared with the cross-sectional portion shown at the left of the vertical center line. In both cases however the spacing of the peripheral edge of counter electrode 3 from the peripheral edge of barrier electrode 4, is a multiple, namely approximately four times, of the length of the direct current path extending between electrodes 3 and 4 across the thickness of disc 2.

Assume that the external p-n limit is short circuited over its entire peripheral length by bridging. Then, referring to a semiconductor disc of uniform thickness as shown in the left-hand portion of Fig. 1, there still remains a resistance R in series with the short circuit, this resistance being:

$$R=\frac{\rho}{2\pi d}\cdot\ln\frac{r_2}{r_1}$$

wherein $d$ is the thickness of the semiconductor disc as shown in Fig. 1, and $\rho$ is the specific resistance of the semiconductor body. This series resistance formed by the "protective margin" or free portion of the semiconductor body can be further increased by reducing the thickness ($d$) of this protective semiconductor margin by etching or grinding as shown in the right-hand portion of Fig. 1, the reduction being effected over the entire periphery of the device. The series resistance can further be increased by selection of a semiconductor material of greatest possible high-ohmic resistance. It will be understood that in practice the entire external p-n limit is hardly ever bridged on its entire peripheral length. Any local bridging will thus produce an only slight leakage current which must pass through the above-mentioned high-ohmic series resistance formed by the protective margin of the semiconductor body.

Located on the bottom side of the disc is a metallic carrier body 5 of greater size and larger volume than the barrier electrode 4. The carrier body 5 is preferably made of a metal whose thermal coefficient of expansion is as close as possible to that of the semiconductor material. For example, tungsten and molybdenum have been found to be suitable carrier metals for semiconductor bodies of silicon. The carrier body 5, aside from supporting or mounting the semiconductor unit, may also serve to improve cooling and hence may be provided or connected with suitable cooling devices which, if desired, may consist of a different metal. For instance, the carrier plate 5 may be connected with a cooling block of large heat capacity made of copper, or the carrier plate may be heat-conductively joined with cooling ducts traversed by a liquid coolant, or the carrier may be provided with cooling vanes or ribs.

The carrier body 5 may be joined with the barrier electrode 4 by soldering or alloying. This is preferably done by simultaneously joining the two electrodes as well as the carrier body with the semiconductor disc with the aid of a single heat processing step. It is particularly favorable for this purpose to cut the electrodes in the necessary shapes from the foils of the proper metals and to place them face-to-face together with the semiconductor disc and the carrier body. The assembly is then embedded in heat-resistant neutral powder, such as graphite or magnesium, which is thereafter compacted around the assembly in intimate contact with all exterior surfaces. The embedded assembly is then subjected to the necessary heat for a sufficient time to form alloys between the electrodes and the semiconductor body on the one hand, and between the barrier electrodes and the carrier plate on the other hand. Due to the embedding, the proper position of the components relative to each other is most reliably secured and a uniform depth of penetration of the alloying metals into the semiconductor disc is likewise obtained.

In the embodiment according to Fig. 1 the external p-n limit along the cylindrical surface portion of the disc is relatively difficult to reach for further processing, for instance etching. For facilitating such further processing, the barrier electrode 4 may be extended around the peripheral surface of the semiconductor disc as is illustrated in Fig. 2. In this case the p-n junction has its external limit located on the free upper side of the semiconductor disc 2.

Fig. 3 shows a corresponding design of a junction-type transistor. The basis electrode of the transistor is composed of two parts, namely a centrally located, circular part 3*a* and a concentric, ring-shaped part 3*b* which are conductively interconnected by a common lead B. Located on the opposite flat side of the semiconductor disc 2 is the collector electrode 4 which, during operation, is electrically stressed in the blocking direction. The collector electrode 4 is bonded together with a carrier plate 5 in intimate face-to-face contact therewith and is connected through plate 5 with a lead C. A ring-shaped emitter electrode 6, connected with a lead E, is provided on the upper side of the semiconductor disc between the two parts 3*a* and 3*b* of the basis electrode. The radial width of the protective margin on the semiconductor body of this transistor is approximately equal to the spacing between the upwardly extended peripheral edge of collector electrode 4 from the closest portion 3*b* of the basis electrode and amounts to a multiple of the disc thickness.

For the purposes of my invention, the semiconductor discs are preferably given extremely small thickness. For example, silicon discs of tested specimens had a thickness of 0.07 mm. and a diameter of approximately 16 mm. The thickness of the metal foils used for alloy-bonding (gold with about 1% antimony, and aluminum) was 0.03 mm. When producing specimens in this manner, and giving the diameter of the gold foil larger size than the diameter of the semi-conductor disc it was observed that during the alloying operation the gold pulled itself upward along the peripheral face of the semiconductor disc and formed an alloy over the entire thickness of the disc 2 with the semi-conductor's substance, this being illustrated in Fig. 4. As a result the upper side of the semiconductor disc, after completing the alloying process, exhibited a golden margin. Consequently, when using a disc of sufficiently small thickness, there may automatically result an electrode arrangement in which the external p-n limit is located on the free upper side of the semiconductor disc. In order to obtain this result with reliability or, if desired, also with semiconductor discs of larger thickness or, as the case may be, when using other manufacturing devices than described above, a narrow ring-shaped gold foil 4*a* may be placed upon the margin of the semiconductor disc as is shown in Fig. 5. When thereafter performing the alloying process, the two foils 4*a* and 4*b* merge with each other to form a single electrode 4 as illustrated in the embodiment of Fig. 6. The finished electrode extends from the bottom of the semiconductor body around its peripheral surface portion onto the top side so that the external p-n limit is located on the upper side of the semiconductor disc and is conveniently accessible for further processing. The concave curvature of the edge of the barrier electrode 4 in Fig. 4 is advantageous. This edge is less strongly stressed by the electrical field than the other portion of the surface of the electrode.

It will be obvious to those skilled in the art, upon a study of this disclosure, that the invention is not limited to the particular materials, semiconductor shapes and semiconductor uses particularly set forth herein and hence may be given specific embodiments other than those illustrated and described, without departing from the essential features of my invention and within the scope of the claims annexed hereto.

I claim:

1. A semiconductor device comprising a monocrystalline semiconductor flat disc body having a body region of a given type of conductance and a plurality of large-area metal electrodes disposed on respectively faces of the semiconductor disc, at least one of the metal electrodes being a barrier electrode, a layer of the opposite conductance type located adjacent the barrier electrode and formed in the semiconductor body, said layer forming a p-n junction with said body region, said barrier electrode covering a flat large-area face of the semiconductor disc to the outer edge of the latter, said plurality of electrodes including at least one barrier-free counter electrode on the opposite large-area face of the semiconductor disc, the barrier electrode extending about the outer peripheral edge of the semiconductor disc, the p-n junction emerging at a surface region of the disc that is not covered by the electrodes.

2. A semiconductor device comprising a monocrystalline semiconductor flat disc body having a body region of a given type of conductance and a plurality of large-area metal electrodes disposed on respectively faces of the semiconductor disc, at least one of the metal electrodes being a barrier electrode, a layer of the opposite conductance type located adjacent the barrier electrode and formed in the semiconductor body, said layer forming a p-n junction with said body region, said barrier electrode covering a flat large-area face of the semiconductor disc to the outer edge of the latter, said plurality of electrodes including at least one barrier-free counter electrode on the opposite large-area face of the semiconductor disc, the barrier electrode extending about the outer peripheral edge of the semiconductor disc, the p-n junction emerging at a surface region of the disc that is not covered by the electrodes, the edge of the barrier layer being curved concavely, the concavity facing laterally toward the peripheral edge of the semiconductor disc, the minimum spacing between said emergent p-n junction and the edges of all counter electrodes being a multiple of the thickness of the semiconductor disc.

3. A semiconductor device comprising a monocrystalline semiconductor flat disc body having a body region of a given type of conductance and a plurality of large-area metal electrodes disposed on respective faces of the semiconductor disc, at least one of the metal electrodes being a barrier electrode incorporating a doping substance, a layer of the opposite conductance type located adjacent the barrier electrode and formed by diffusion of the doping substance into the semiconductor body, said layer forming a p-n junction with said body region, said barrier electrode covering a flat large-area face of the semiconductor disc to the outer edge of the latter, said plurality of electrodes including at least one barrier-free counter electrode on the opposite face of the semiconductor disc, the barrier electrode extending about the outer peripheral edge of the semiconductor disc and covering a marginal strip of the said opposite face of the disc, the p-n junction emerging in the form of a curved line at said opposite face and extending along the perimeter of said marginal strip, the minimum spacing between said curved line and the peripheral edges of all counter electrodes being a multiple of the thickness of the semiconductor disc.

4. A transistor semiconductor device comprising a monocrystalline semiconductor flat disc body having a body region of a given type of conductance and a plurality of large-area metal electrodes disposed on respective faces of the semiconductor disc, at least one of the metal electrodes being a barrier electrode, a layer of the opposite conductance type located adjacent the barrier electrode and formed in the semiconductor body, said layer forming a p-n junction with said body region, said barrier electrode comprising the collector and covering a flat large-area face of the semi-conductor disc to the outer edge of the latter, said plurality of electrodes including concentrically disposed inner emitter and outer base electrodes on the opposite large-area face of the semiconductor disc, the barrier electrode extending about the outer peripheral edge of the semiconductor disc, the p-n junction emerging from said disc in a curved line on said opposite large-area face, the minimum spacing between said emergent p-n junction and the outermost peripheral edge of the base electrode being a multiple of the thickness of the semiconductor disc.

5. A transistor semiconductor device comprising a monocrystalline semiconductor flat disc body having a body region of a given type of conductance and a plurality of large-area metal electrodes disposed on respective faces of the semiconductor disc, at least one of the metal electrodes being a barrier electrode, a layer of the opposite conductance type located adjacent the barrier electrode and formed in the semiconductor body, said layer forming a p-n junction with said body region, said barrier electrode comprising the collector and covering a flat large-area face of the semiconductor disc to the outer edge of the latter, said plurality of electrodes including concentrically disposed inner emitter and outer base electrodes on the opposite large-area face of the semiconductor disc, the barrier electrode extending about the outer peripheral edge of the semiconductor disc, the p-n junction emerging from said disc in a curved line on said opposite large-area face, the minimum spacing between said emergent p-n junction and the outermost peripheral edge of the base electrode being a multiple of the thickness of the semiconductor disc, said barrier electrode comprising a metal foil incorporating a doping substance to produce said opposite conductance type, and an outer metal carrier plate facing the metal foil, and a collector lead connected to said carrier plate.

6. A semiconductor device, comprising a substantially monocrystalline, semiconductor wafer of given conductance type and a plurality of large-area electrodes on opposite large-area faces of said wafer, at least one of said electrodes being a barrier electrode incorporating a doping substance forming in said wafer an adjacent zone of the opposed conductance type, thereby providing a p-n junction, whereas another one of said electrodes located on the opposite large-area face of said wafer is a barrier-free counter electrode, said barrier electrode having an area protruding outwardly beyond the vertical projection of said counter electrode, and said p-n junction emerging at a surface region of the wafer that is free of said electrodes, where it constitutes the location of the external p-n boundary, said external boundary being spaced from the edge of said counter electrode a distance greater than the length of the minimum current path between said barrier electrode and counter electrode, said barrier electrode extending from one large-area face of said wafer over the peripheral edge of said wafer and covering also a marginal portion along the periphery of said opposite face thereof, and further comprising a carrier body of metal joined with said barrier electrode in face-to-face relation therewith and being thicker and having a larger volume than said barrier electrode.

7. A semiconductor device, comprising a substantially monocrystalline, semiconductor wafer of given conductance type and a plurality of large-area electrodes on opposite large-area faces of said wafer, at least one of said electrodes being a barrier electrode incorporating a doping substance forming in said wafer an adjacent zone of the opposed conductance type, thereby providing a p-n junction, whereas another one of said electrodes located on the opposite large-area face of said wafer is a barrier-free counter electrode, said barrier electrode having an area protruding outwardly beyond the vertical projection of said counter electrode, and said p-n junction emerging at a surface region of the wafer free of the said electrodes, where it constitutes the location of the external p-n boundary, said external boundary being spaced from the edge of said counter electrode a distance that is a multiple of the length of the minimum current path between said barrier electrode and counter electrode, said barrier electrode extending from one large-area face of said wafer over the peripheral edges of said wafer and covering also a marginal portion along the periphery of said opposite face thereof, and further comprising a carrier body of metal joined with said barrier electrode in face-to-face relation therewith and being thicker and of larger volume than said barrier electrode.

8. The device defined in claim 7, the wafer being of silicon, the barrier electrode being a gold foil incorporating antimony as said doping substance.

9. The device defined in claim 3, the disc being of silicon, the barrier electrode being a gold foil incorporating antimony as said doping substance.

10. A semiconductor device, comprising a substantially monocrystalline and plate-shaped semiconductor body of given conductance type and a plurality of large-area electrodes on large-area faces of said body, at least one of said electrodes being a barrier electrode, said body having formed therein a barrier electrode-adjacent zone of the opposed conductance type to provide a p-n junction, whereas another one of said electrodes located on the opposite large-area face of said body is a counter electrode having a barrier-free metallic terminal contact with the body, said barrier electrode having its entire outer edge protruding outwardly beyond the vertical projection of said contact of the counter electrode, said p-n junction emerging at an electrode-free surface portion of the body, where it constitutes the location of the external p-n boundary limit, said external boundary limit being throughout its length located outwardly of the edge of the counter electrode and being spaced from the edge of said counter electrode a minimum distance which is a multiple of the plate thickness between said barrier electrode and said counter electrode, whereby the current path from said external boundary limit to the barrier-free electrode has a higher electric resistance per unit area of the path cross section than the current path of the operating electric current between the barrier electrode and the barrier-free electrode.

11. A semiconductor device, comprising a circular disc-shaped semiconductor crystal body of given conductance type, a doping substance-containing barrier electrode joined with said body on one large-area face thereof and extending to the peripheral edge thereof, said semiconductor body having adjacent to said barrier electrode a zone of the opposite conductance type forming a p-n junction in said body, into which zone the doping substance is diffused, a barrier-free counter electrode centrally located on the other large-area face of said body and having circular shape and a smaller diameter than said body to leave an annular surface area of said body exposed, said p-n junction emerging at an electrode-free surface portion of the body, where it constitutes the location of the external p-n boundary limit, said external boundary limit being throughout its length located outwardly of the edge of the counter electrode and being spaced from the edge of said counter electrode a minimum distance which is a multiple of the disc thickness of said body between said barrier electrode and said counter electrode, whereby the current path from said external boundary limit to the barrier-free electrode has a higher electric resistance per unit area of the path cross section than the current path of the operating electric current between the barrier electrode and the barrier-free electrode.

12. A semiconductor device, comprising a circular disc-shaped semiconductor crystal body of given conductance type, a doping substance-containing barrier electrode joined with said body on one large-area face thereof and extending to the peripheral edge thereof, said semiconductor body having adjacent to said barrier electrode a zone of the opposite conductance type forming a p-n junction in said body, into which zone the doping substance is diffused, a barrier-free counter electrode centrally located on the other large-area face of said body and having circular shape and a smaller diameter than said body to leave an annular surface area of said body exposed, said p-n junction emerging at an electrode-free surface portion of the body, where it constitutes the location of the external p-n boundary limit, said external boundary limit being throughout its length located outwardly of the edge of the counter electrode and being spaced from the edge of said counter electrode a minimum distance which is a multiple of the disc thickness of said body between said barrier electrode and said counter electrode, whereby the current path from said external boundary limit to the barrier-free electrode has a higher electric resistance per unit area of the path cross section than the current path of the operating electric current between the barrier electrode and the barrier-free electrode, said barrier electrode extending continuously over the entire diameter of said semiconductor body and covering its entire surface area on said one large-area face.

13. A semiconductor device, comprising a substantially monocrystalline and plate-shaped semiconductor body of given conductance type and a plurality of large-area electrodes on large-area faces of said body, at least one of said electrodes being a barrier electrode, said body having formed therein a barrier electrode-adjacent zone of the opposed conductance type to provide a p-n junction, whereas another one of said electrodes located on the opposite large-area face of said body is a counter electrode having a barrier-free metallic terminal contact with the body, said barrier electrode having its entire outer edge protruding outwardly beyond the vertical projection of said contact of the counter electrode, said p-n junction emerging at an electrode-free surface portion of the body, where it constitutes the location of the external p-n boundary limit, said external boundary limit being throughout its length located outwardly of the edge of the counter electrode and being spaced from the edge of said counter electrode a minimum distance which is a multiple of the plate thickness between said barrier electrode and said counter electrode, whereby the current path from said external boundary limit to the barrier-free electrode has a higher electric resistance per unit area of the path cross section than the current path of the operating electric current between the barrier electrode and the barrier-free electrode, said barrier electrode extending from said one large-area face of said disc-shaped semiconductor body over the adjacent peripheral edge and over the peripheral surface of the opposite large area face of said body.

14. A semiconductor device, comprising a substantially monocrystalline and plate-shaped semiconductor body of given conductance type and a plurality of large-area electrodes on large-area faces of said body, at least one of said electrodes being a barrier electrode, said body having formed therein a barrier electrode-adjacent zone of the opposed conductance type to provide a p-n junction, whereas another one of said electrodes located on the opposite large-area face of said body is a counter electrode having a barrier-free metallic terminal contact with the body, said barrier electrode having its entire outer edge protruding outwardly beyond the vertical projection of said contact of the counter electrode, said p-n junction emerging at an electrode-free surface portion of the body, where it constitutes the location of the external p-n boundary limit, said external boundary limit being throughout its length located outwardly of the edge of the counter electrode and being spaced from the edge of said counter electrode a minimum distance which is at least three times the plate thickness between said barrier electrode and said counter electrode, whereby the current path from said external boundary limit to the barrier-free electrode has a higher electric resistance per unit area of the path cross section than the current path of the operating electric current between the barrier electrode and the barrier-free electrode.

15. An asymmetrically conducting semiconductor device, comprising a substantially monocrystalline disc of p-type silicon, a donor-containing barrier electrode joined with said body on one flat side thereof and forming together with said body an n-type diffusion zone and a p-n junction, an ohmic-contact barrier-free counter electrode fusion-joined with said body on the other flat side thereof, said p-n junction emerging at an electrode-free surface portion of the body, where it constitutes the location of the extrenal p-n boundary limit, said external boundary limit being throughout its length located outwardly of the edge of the counter electrode and being spaced from the edge of said counter electrode a minimum distance which is a multiple of the thickness of said body between said two electrodes, whereby the current path from said external boundary limit to the barrier-free electrode has a higher electric resistance per unit area of the path cross section than the current path of the operating electric current between the barrier electrode and the barrier-free electrode.

References Cited in the file of this patent

UNITED STATES PATENTS

| | | |
|---|---|---|
| 2,666,814 | Shockley | Jan. 19, 1954 |
| 2,703,855 | Koch et al. | Mar. 8, 1955 |
| 2,748,041 | Leverenz | May 29, 1956 |
| 2,805,347 | Haynes et al. | Sept. 3, 1957 |
| 2,806,187 | Boyer et al. | Sept. 10, 1957 |
| 2,815,304 | Gudmundsen | Dec. 3, 1957 |
| 2,842,724 | Thedieck | July 8, 1958 |